United States Patent [19]

Riccó et al.

[11] Patent Number: 5,493,141
[45] Date of Patent: Feb. 20, 1996

[54] METHOD AND CIRCUIT FOR TUNNEL-EFFECT PROGRAMMING OF FLOATING GATE MOSFET TRANSISTORS

[75] Inventors: Bruno Riccó; Massimo Lanzoni, both of Bologna; Luciano Briozzo, Carnate, all of Italy

[73] Assignee: SGS-Thomson Microelectronics S.r.l., Agrate Brianza, Italy

[21] Appl. No.: 231,071

[22] Filed: Apr. 21, 1994

[30] Foreign Application Priority Data

Apr. 22, 1993 [EP]  European Pat. Off. ............... 93830172

[51] Int. Cl.⁶ .................................................. G11C 16/06
[52] U.S. Cl. ........................... 257/321; 257/318; 257/328; 257/368; 257/350; 257/379; 327/208; 327/199; 327/224
[58] Field of Search ................................. 365/149, 185, 365/182; 257/318, 328, 368, 321, 350, 379; 327/208, 199, 224

[56] References Cited

U.S. PATENT DOCUMENTS

| | | | |
|---|---|---|---|
| 3,972,059 | 7/1976 | Distefano | 357/6 |
| 4,185,319 | 1/1980 | Stewart | 365/185 |
| 4,616,245 | 10/1986 | Topich et al. | 257/318 |
| 5,138,576 | 8/1992 | Madurawe | |
| 5,253,196 | 10/1993 | Shimabukuro et al. | 365/149 |

FOREIGN PATENT DOCUMENTS

| | | | |
|---|---|---|---|
| 0541221 | 5/1993 | European Pat. Off. | G11C 16/06 |
| 2204203 | 11/1988 | United Kingdom | G11C 17/00 |

OTHER PUBLICATIONS

Patent Abstracts of Japan, vol. 5, No. 73 (P–61)(745) May 15, 1981 & JP-A-5619589.

*Primary Examiner*—Viet Q. Nguyen
*Attorney, Agent, or Firm*—David M. Driscoll; James H. Morris

[57] ABSTRACT

The present programming method exploits the close dependence of tunneling current on the voltage drop across the tunnel oxide layer. A bootstrapped capacitor connected to the drain terminal of the transistor is employed. The charge state of the capacitor determines the bias of the tunnel oxide and is in turn determined by the charge state in the floating gate. Biasing by the bootstrapped capacitor is such as to permit passage of the tunneling current and, hence, a change in the threshold voltage of the transistor until the floating gate reaches the desired charge level, and to prevent passage of the tunneling current upon the transistor reaching the desired threshold. Programming is thus performed automatically and to a predetermined degree of accuracy, with no need for a special circuit for arresting the programming operation when the desired threshold is reached.

32 Claims, 3 Drawing Sheets

METHOD AND CIRCUIT FOR TUNNEL-EFFECT PROGRAMMING OF FLOATING GATE MOSFET TRANSISTORS

BACKGROUND OF THE INVENTION

1. Field of the Invention

The present invention relates to a method and circuit for tunnel-effect programing of floating-gate MOSFET transistors, and is especially advantageous for programing nonvolatile EEPROM and flash-EEPROM memories.

2. Discussion of the Related Art

Nonvolatile semiconductor memories, in particular electrically erasable programmable types, have assumed great importance by virtue of being able to store and preserve information for prolonged periods (decades, under normal operating conditions) even in the absence of a power supply, thus providing a solution to all those applications in which information must be preserved when the equipment or device to which the memories are connected is turned off.

Nonvolatile memories may be digital or analog (the latter of more recent and less widespread application), and generally comprise numerous elementary cells for storing an elementary item (a bit in the case of digital memories, a specific electric level in the case of analog types). Regardless, however, of the type of fabrication technology employed, the information stored in any commercial memory cell is represented by a given charge (e.g., excess electrons) inside the cell, and more specifically in a region (e.g., a floating gate) insulated electrically from the rest of the cell.

In digital applications, the stored charge assumes two values corresponding respectively to storage of a logic "0" or "1"; whereas, in the case of analog memories, the charge varies within certain limits, and is correlated to the electric level of the signals to be stored via appropriate read and write circuits.

The main problem in programming nonvolatile memory cells lies in controlling the stored charge.

This is particularly important in the case of analog applications, wherein charge control determines the resolution and accuracy with which the electric signal is stored. Charge control is also important in the case of digital memories for minimizing as far as possible the difference between the charges corresponding to the two logic states (also referred to as the write and erase states of the cell) and so minimizing wear and extending the working life of the cell. Moreover, in the case of flash-EEPROM memories, charge control is essential for minimizing read errors due, for example, to the presence of overerased cells.

As we know, the charge of the memory cells in question is altered by Fowler-Nordheim-effect tunneling of a thin dielectric layer in EEPROM and flash-EEPROM cells. Since tunneling depends exponentially on the electric field involved, and since the programming current is extremely low (a few nA), it is difficult to design a circuit capable of automatically limiting the injected charge on the basis of quantities (voltage or current) set during programming, and so accurately controlling the stored charge.

One proposal for solving this problem is to sample the state of the cell during programming, and to interrupt programming upon the stored charge or a quantity which is a direct function of it, assuming a predetermined value.

For example, it has already been proposed (see U.S. Pat. Nos. 4,357,685 and 4,890,259) to divide the programming cycle into a given number of short partial subcycles during each of which only a small fraction of the charge required for the cell to assume the desired final state is injected. At the end of each partial cycle, the state of the cell is tested to determine whether to continue with further partial cycles, or to terminate programming by virtue of the required charge being achieved. The state of the cell is tested on the basis of various electric quantities related to the charge stored in the floating gate, for example, cell threshold, current flow under given bias conditions, etc.

This solution presents several major drawbacks, mainly due to the discrete nature of the charge state achievable, and also due to the dependence of resolution of the injected charge on the number and duration of the partial cycles. Consequently, accuracy is improved only in conjunction with an increase in the number of cycles and, consequently, in programming time, so that, in practice, a trade-off is inevitable between programming time and accuracy, the results of which are not always satisfactory. As a result, the above known method is limited solely to applications wherein no more than rough control of the stored charge is required.

It is therefore a general goal of the present invention to provide a programming method designed to overcome the drawbacks typically associated with known solutions, and which in particular provides for straightforward, high precision programming of MOSFET transistors.

SUMMARY OF THE INVENTION

According to the present invention, there is provided a method of tunnel-effect programming floating-gate MOSFET transistors.

The present invention also provides to a circuit for tunnel-effect programming floating-gate MOSFET transistors.

In practice, the present invention exploits the close dependence of the tunneling current on the voltage drop across the oxide layer. Therefore, a bootstrapped capacitor is employed, optionally in series with a voltage source. The charge of the capacitor determines the tunnel oxide bias, and in turn is critically dependent on the state of the MOSFET transistor. The bias produced by the capacitor is such as to allow passage of the tunneling current until the floating gate reaches the required charge, and to cut off the tunneling current upon the transistor reaching the required threshold, thus terminating programming of the cell. As such, programming is terminated automatically and to a predetermined degree of accuracy, with no need for a special circuit for terminating the programming operation upon the required threshold being reached.

In particular, when erasing a transistor presenting an excessive charge at the floating gate, and hence a higher threshold voltage than desired, the transistor is biased at the control gate to a value correlated to the desired threshold level. The drain is connected to the bootstrapped capacitor, which has been charged beforehand, so that the resulting voltage drop across the tunnel oxide is such as to extract electrons from the floating gate through the tunnel oxide, and so reduce the threshold voltage. In view of the low tunneling current involved, substantially no discharge of the capacitor occurs. Charge extraction continues until the threshold voltage reaches the desired value. At this point, a high current is conducted by the transistor, thus rapidly discharging the bootstrapped capacitor, which discharge in turn reduces the voltage drop across the tunnel oxide, and arrests charge extraction from the floating gate, thus automatically terminating the programming step at the required value.

Conversely, when writing a transistor having a lower threshold voltage than desired, the transistor is biased accordingly to the desired threshold value. The drain is connected to the capacitor, which has been charged beforehand, so as to turn on the transistor and rapidly discharge the capacitor. The control gate of the transistor is then supplied with a write potential of such a value that, with the capacitor discharged, the voltage drop across the tunnel oxide is sufficient to tunnel charges towards the floating gate, thus increasing the threshold voltage. The capacitor is then recharged and connected to the transistor, and the above cycle is repeated several times. Consequently, upon charge injection bringing the threshold of the transistor to the desired value, and the (charged) capacitor being connected to the transistor, the transistor is not turned on, and the capacitor is only partially discharged. When the write potential is applied to the control gate of the transistor, therefore, the voltage drop across the gate oxide of the transistor is reduced so that no further charges can be injected the write step is arrested, and, in the following cycles, the transistor remains at the desired threshold value.

BRIEF DESCRIPTION OF THE DRAWINGS

Two preferred, non-limiting embodiments of the present invention will be described by way of example with reference to the accompanying drawings, in which.

DETAILED DESCRIPTION

To begin with, a preferred embodiment will be described for erasing a floating-gate MOSFET transistor defining, for example, a nonvolatile memory array cell. As we know, the erase step involves removing electric charges, i.e., electrons, from the floating gate of the cell to reduce its threshold voltage. The threshold voltage is that value of the voltage to be applied between the control gate region and the source region of the cell which causes the cell to be turned on.

Figure 1:
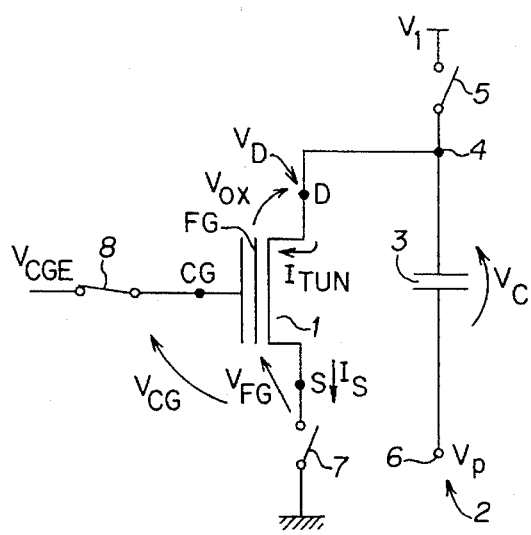
FIG. 1 shows the bias circuit of a floating gate MOSFET transistor for effecting controlled erase, according to a first embodiment of the present invention.

FIG. 1 shows a transistor 1 and a drive circuit 2 substantially comprising a bootstrapped capacitor 3 and a number of switches. More specifically, capacitor 3 presents a first terminal 4 connected to the drain terminal D of transistor 1 and to supply voltage $V_1$ via switch 5 and a second terminal 6 at voltage $V_p$, preferably an increasing ramp voltage, followed by a constant value up to the end of the erase step. The source terminal S of transistor 1 is grounded via switch 7 and the control gate terminal CG is biased to a constant voltage $V_{CGE}$ via switch 8.

Capacitor 3 must present a capacitance of over, for example, roughly ten times the parasitic capacitance between the drain region and substrate of transistor 1, e.g., 100 fF.

Assuming transistor 1 presents a higher threshold voltage than desired, due to an excess of electrons at the floating gate, and must therefore be erased, according to a first embodiment of the present method, capacitor 3 is precharged to voltage $V_1$ by closing switch 5 and maintaining terminal 6 grounded. During this step, switches 7 and 8 are open. Switch 5 is then opened and switches 7 and 8 closed so as to ground source terminal S of transistor 1 and connect control gate terminal CG to voltage $V_{CGE}$ correlated to the desired threshold voltage, as shown below. Drain terminal D of transistor 1 is thus at voltage $V_D=V_1$; and $V_p$ is increased linearly to bring about a similar increase in voltage $V_D$ at the drain terminal, by virtue of the latter being related to Vp by the equation:

$$V_D=V_pC/(C+CD)$$

where C is the capacitance of capacitor 3, and CD the capacitance between the drain region and ground (substrate of the transistor).

When $V_D$ becomes high enough, tunneling current flows through capacitor 3 to floating gate FG of transistor 1, thus reducing the charge stored in the floating gate and so gradually reducing the threshold voltage of the transistor.

As tunneling current $I_{TUN}$ at this step is very low (in the order of tenths of a nA), substantially no change occurs in the charge of bootstrapped capacitor 3 or its voltage $V_C$.

As the charge stored in floating gate FG is reduced gradually, the threshold voltage of transistor 1 eventually reaches the desired value set by $V_{CGE}$, at which point, transistor 1 switches on and conducts rapidly increasing source current $I_S$, the value of which is such as to rapidly discharge the capacitor and so rapidly reduce voltage $V_C$. As a result, drain voltage $V_D$ not only stops increasing linearly with $V_p$ but is actually decreased slightly. This decrease, however, is sufficient to reduce and cut off tunneling current $I_{TUN}$, thus automatically arresting erasure of the transistor and freezing the value of the stored charge.

The final charge stored in the floating gate thus depends on voltage $V_{CGE}$, by virtue of this determining the charge needed to turn on the transistor and, hence, for arresting the programming operation. This voltage, being fixed during programming and controllable continuously, provides for achieving a high degree of resolution as regards control of the final charge in the floating gate and, hence, the final threshold. Programming is also largely independent of, and so presents a good degree of immunity to, the characteristics of the programming ramp, wear of the tunnel oxide, and the initial charge in the floating gate.

Figure 3:
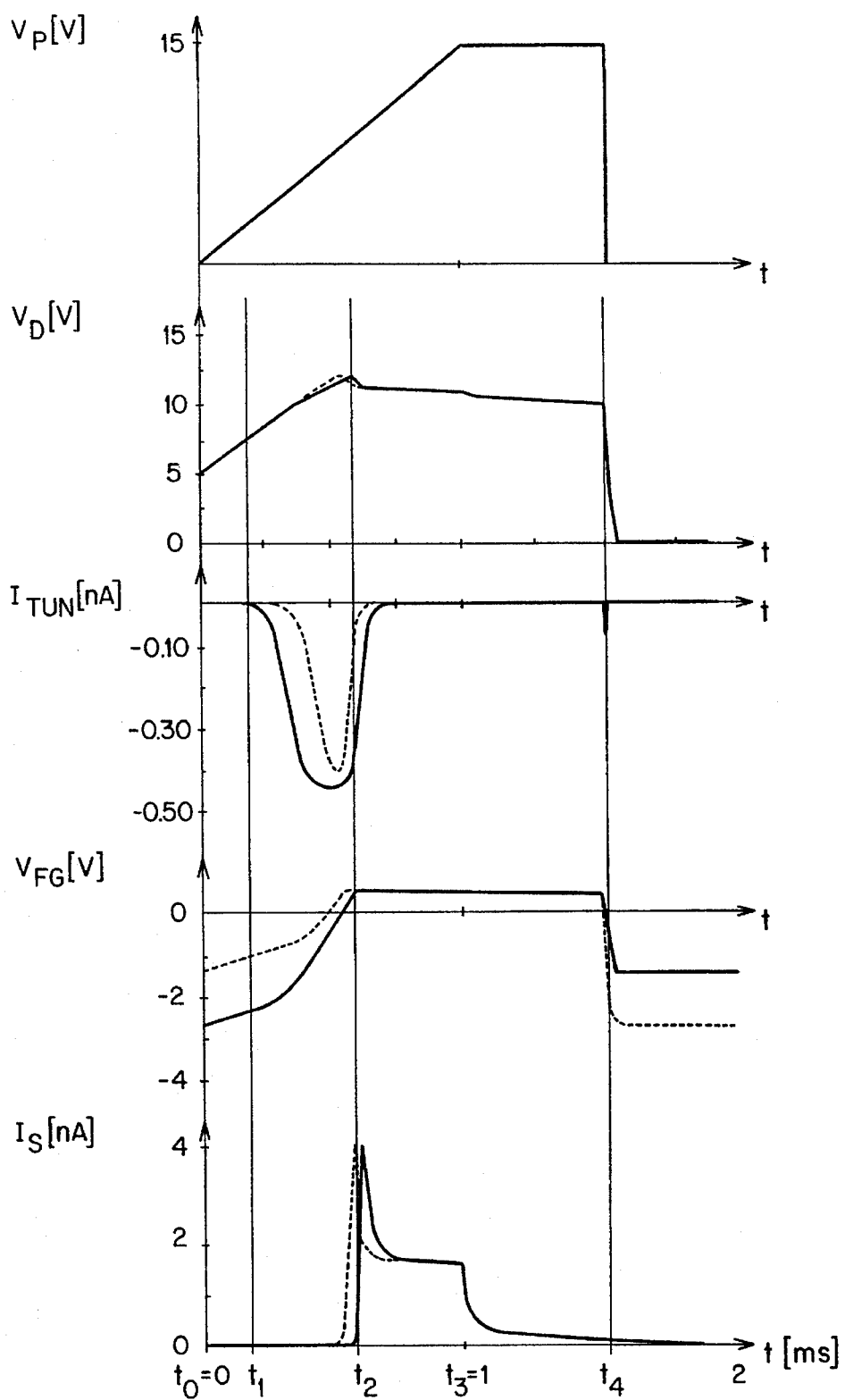
FIG. 3 shows graphs of a number of significant electric quantities during the controlled erase step.

FIG. 3 shows graphs of a number of electric quantities relative to a transistor 1 connected to bias circuit 2 in FIG. 1 during erasure, and for two different desired threshold voltage values. In both cases, transistor 1 presented an initial threshold voltage of 6.95 V, corresponding to a floating gate voltage with respect to ground VFG=−4 V with all the terminals of the cell grounded. In both cases, $V_1$=5 V, and $V_p$ was increased linearly from 0 to 15 V between times $t_0$=0 and $t_3$=1 ms, and held at the maximum value up to time $t_4$.

Before time $t_0$, the capacitor was charged to voltage $V_1$, bringing the drain terminal $V_D$ to 5 V. At time $t_0$, voltage $V_{CGE}$=1 V is applied to the control gate terminal. As shown by the solid line curves, voltage $V_D$ begins increasing, following voltage $V_p$. Floating gate voltage $V_{FG}$ also increases, but more slowly, due to capacitive coupling of the floating gate to the control gate, so that voltage drop $V_{ox}$ between the floating gate region and the drain terminal also increases.

At time $t_1$, $V_{ox}$ reaches such a value as to produce a significant tunneling current $I_{TUN}$. Thus, charge in the floating gate region decreases, but with no substantial change in the charge of the capacitor, as shown by the voltage $V_D$ curve.

At time $t_2$, the remaining charge in the floating gate is such that transistor 1 switches on, thus discharging capacitor 3. Current $I_S$ peaks; voltage $V_D$ decreases; and current $I_{TUN}$ is reduced. At instant $t_4$, all the transistor terminals are grounded for evaluation.

Operation when voltage $V_{CGE}$ is set to 3 V is shown by the dotted line curves. This operation similar to that described above, except that erasure of transistor 1 commences later due to the higher voltage of floating gate FG. Also, due to transistor 1 being turned on earlier, a much smaller total charge is extracted, so that the final floating gate voltage $V_{FG}$ is lower.

Figure 4:
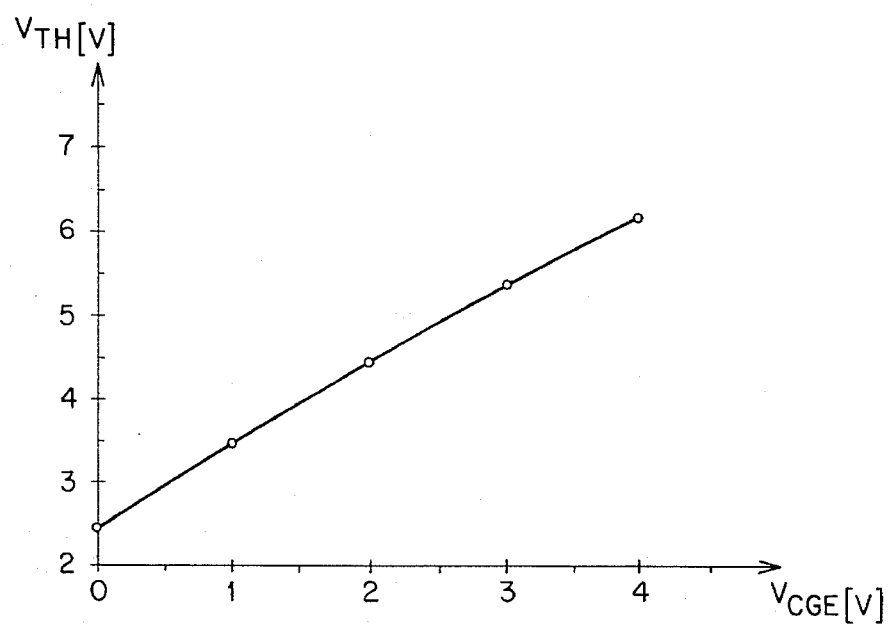
FIG. 4 shows a graph of the threshold voltage of the cell as a function of control gate voltage, following controlled erase according to the present invention.

FIG. 4 shows the relationship between threshold voltage $V_{TH}$, following erasure according to the present method, and applied control gate voltage $V_{CGE}$, as determined in experimental tests performed using various $V_{CGE}$ values. As can be seen, the relationship is linear with a high degree of precision over a wide range of values, as required for precision analog applications. It should be pointed out that testing was conducted using a transistor with a non-negligible capacitive coupling between the floating gate and drain, which makes threshold voltage $V_{TH}$ also dependent on $V_D$. The capacitive coupling may, however, be reduced in any suitable manner known those skilled in the art. The dependence of voltage $V_{CGE}$ on the desired $V_{TH}$ value may be calculated. If necessary, special circuits may be provided for automatically generating voltage $V_{CGE}$ on the basis of the desired threshold.

The controlled erase procedure described above may be employed in erase mode, for reducing the cell and transistor threshold value, as well as in write mode, for increasing the cell and transistor threshold by initially overwriting the transistor to above the desired final value and then erasing it in a controlled manner, as described above. Particularly in the case of nonvolatile memories, however, it is frequently desirable not to overwrite the cells, to prevent impairing or reducing reliability of the tunnel oxide layer. Therefore a second controlled write procedure may be adopted as described.

Figure 2:
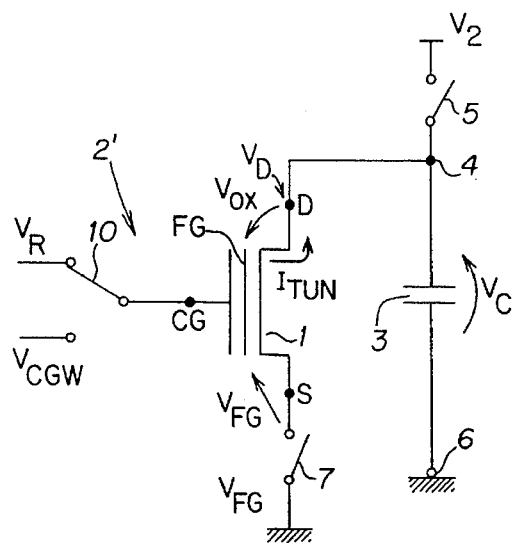
FIG. 2 shows the bias circuit of a floating-gate MOSFET transistor for effecting controlled write, according to a second embodiment of the present invention.

FIG. 2 shows the drive circuit 2' for performing the controlled write procedure. In view of the similarity between this and circuit 2 in FIG. 1, both of which may be standardized with only minor alterations, any parts common to both are indicated using the same reference numerals. In the FIG. 2 circuit, bootstrapped capacitor 3 presents terminal 6 grounded, and terminal 4 connected via switch 5 to voltage $V_2$. Control gate terminal CG is connected to a switch 10 for selectively connecting the control gate to voltage $V_R$ or $V_{CGW}$, where $V_R$ is a rising or continuous voltage for enabling passage of the tunneling current and, hence, electron injection into the floating gate, and $V_{CGW}$ is correlated to the desired threshold voltage.

Figure 5:
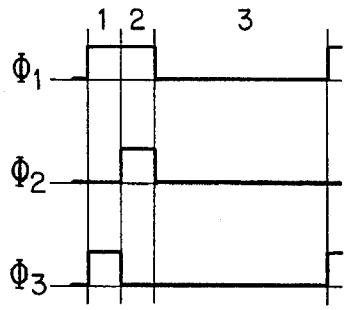
FIG. 5 shows graphs of a number of control signals in the FIG. 2 circuit.

A preferred embodiment will now be described with reference also to FIG. 5, which shows graphs of the control signals $\Phi 1$, $\Phi 2$, $\Phi 3$ of respective switches 10, 7, 5, and wherein a high level of signals $\Phi 3$, $\Phi 2$ of switches 5, 7 corresponds to a closed switch, and a low level to an open switch, and a high level of signal $\Phi 1$ of switch 10 corresponds to connection of the control gate to $V_{CGW}$, and a low level to connection to $V_R$.

To begin with, the capacitor is charged to a medium/high voltage $V_2$, such as to prevent the passage of tunneling current when the control gate is at voltage $V_R$ and capacitor 3 is charged. During the time period indicated by 1 in FIG. 5, switch 7 is open, and switch 10 connects the control gate to voltage $V_{CGW}$. During the time period 2 in FIG. 5, switch 5 is opened, switch 10 remains in the same position as before, thus supplying voltage $V_{CGW}$ to control gate terminal CG, and switch 7 is closed. Since transistor 1 presents a threshold below the desired value, the transistor 1 turns on, thus rapidly discharging capacitor 3 and conducting a high current $I_S$. During the time period 3 in FIG. 5, switch 7 is opened; switch 10 switches to supply voltage $V_R$ to the control gate; switch 5 remains open; and, since the capacitor is fully or mostly discharged, voltage $V_D$ at the drain terminal is low, and voltage $V_{ox}$ across the tunnel oxide is such as to generate tunneling current $I_{TUN}$ towards the drain region, thus injecting electrons into floating gate FG and so increasing the threshold voltage.

Capacitor 3 is then recharged by closing switch 5 and switching switch 10, while switch 7 remains open. The above three-step cycle is repeated, the threshold voltage increasing at each cycle until the desired value is reached. When, during time period 2 of the cycle following the one in which the desired threshold is reached, the capacitor is charged to $V_2$, voltage $V_{CGW}$ is applied to the control gate of transistor 1, and switch 7 is closed. Transistor 1 therefore is held off, or is turned on only partially, thus preventing discharge of capacitor 3 or enabling only a small amount of discharge as compared with the previous cycles, so that drain terminal D remains at a high voltage. During the time period 3 of the same cycle, therefore, when control gate CG of transistor 1 is connected to high voltage $V_R$, voltage drop $V_{ox}$ across the oxide layer is low, thus preventing further electron injection. Even in the event the above cycle is repeated, this has no effect on the stored charge or threshold voltage, the value of which thus remains constant.

Figure 6:
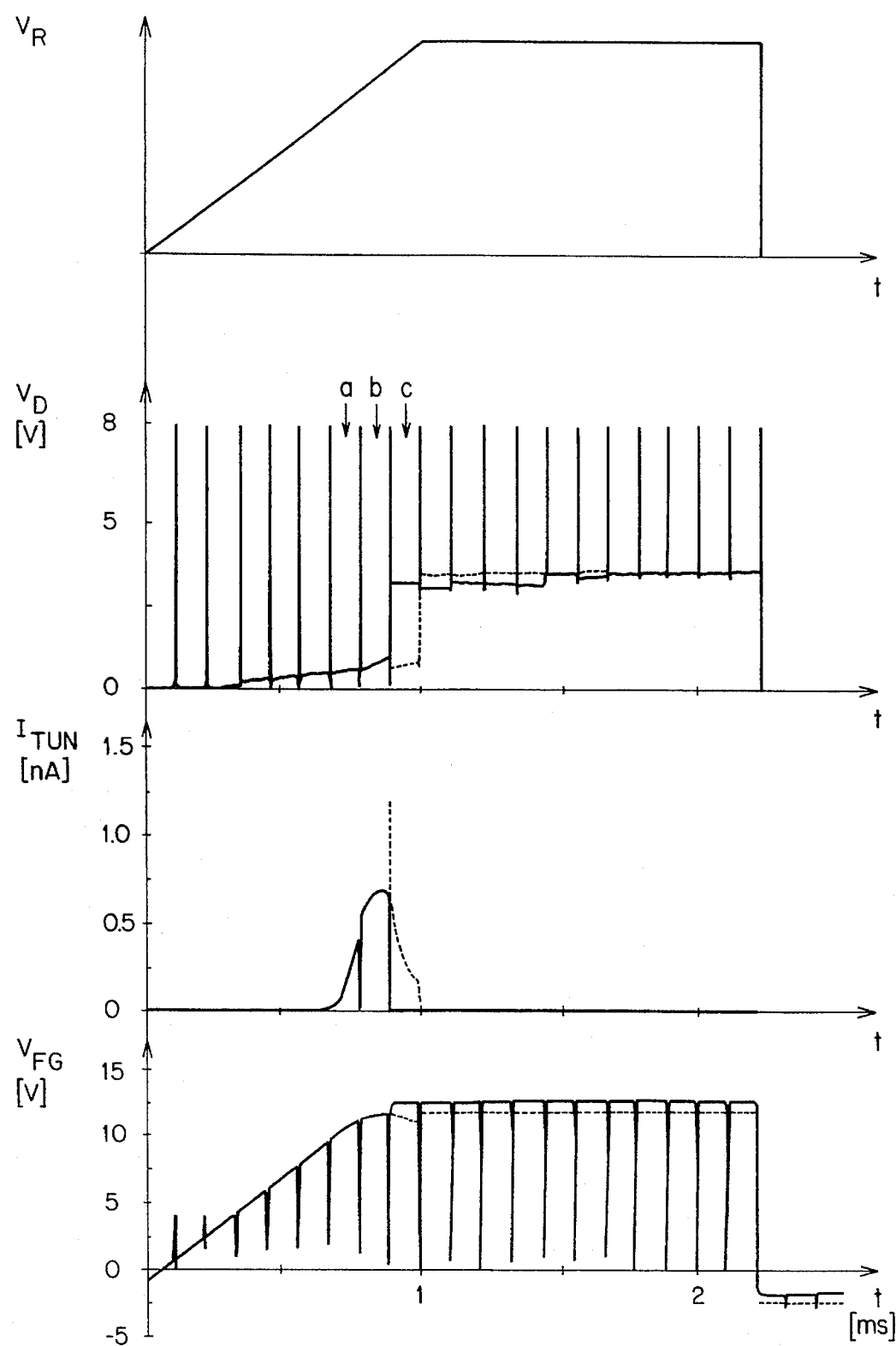
FIG. 6 shows graphs of a number of significant electric quantities during the controlled write step according to the present invention.

FIG. 6 shows electrical operation of two embodiments of the above write method, wherein the write operation is divided into 20 cycles, each lasting 110 µs. In both cases, a voltage V2 of 8 V was selected; and voltage $V_R$ presents the pattern shown, rising initially in a ramp from 0 V to a maximum (e.g., 15 V) at t=1 ms, and then constant up to t=2.2 ms. It should be pointed out, however, that the $V_R$ curve has been simplified. Voltage $V_R$, even over the ramp portion, does not increase continuously as shown, but only in time period 3 of FIG. 5, and remains constant in time periods 1 and 2. In view of the brevity of time periods 1 and 2 as compared with time period 3, however, operation may be approximated as shown.

In the first embodiment, voltage $V_{CGW}$ equals 4 V, in which case, as shown by the solid line curves, drain terminal voltage $V_D$ initially continues switching between 8 V (after charging the capacitor) and 0 V (due to discharging of the capacitor when switch 7 is closed and voltage $V_{CGW}$ is applied to control gate terminal CG). At the same time, the floating gate voltage continues rising, following the increase in $V_R$, with the exception of the peaks, when the capacitor is charged, due to capacitive coupling with the drain region. As voltage VR increases, voltage drop $V_{ox}$ across the oxide layer is eventually sufficient to cause electrons to be injected into the floating gate. This corresponds to cycle a in FIG. 6, in which current $I_{TUN}$ starts flowing when voltage $V_R$ is applied to the control gate. Injection continues into the next cycle b, at the end of which the charge stored in the floating gate has brought about the desired threshold value. Thus, when the capacitor is charged and voltage $V_{CGW}$ is applied to control gate CG, the capacitor discharges only partially; and, when voltage $V_R$ is again applied, no tunneling current is supplied, thus freezing the stored charge at the value reached in cycle b.

In the second embodiment, voltage $V_{CGW}$ equals 5 V, in which case, electron injection also continues into cycle c, as shown by the dotted line curves (in this case in fact, voltage $V_D$ is still low in cycle c) thus enabling greater electron storage and, hence, a higher threshold.

Calculations indicate a final threshold voltage value of 4.49 V with $V_{CGW}$=4 V, and 5.47 V with $V_{CGW}$=5 V. Whichever the case, in write mode also, a good degree of linearity exists between voltage $V_{CGW}$ applied to the control gate and the threshold voltage achievable.

Though more complex than the controlled erase procedure, and despite involving the repetition of elementary cycles and, hence, intrinsic quantization errors, by appropriately selecting the times and voltage values employed, the controlled write procedure provides for a high degree of precision and reliability, with no need for special measuring operations, by virtue, as explained, of the write operation terminating automatically when the desired threshold value is reached.

The advantages of the programming method and circuit according to the present invention will be clear from the foregoing description. In particular, they provide for automatically arresting the programming operation upon the desired threshold being reached. In the case of controlled erase, programming is performed in one cycle, with no charge discretizing problems, and with an excellent trade-off between resolution and programming time. In the case of controlled write, the discretizing error is containable, and the overall performance time of the procedure is less than that required for cyclically measuring the charge, as with traditional methods.

To those skilled in the art it will be clear that changes may be made to the method and circuit described and illustrated herein purely by way of example, without, however, departing from the scope of the present invention. For example, as opposed to a ramp pattern, voltage $V_p$ applied to the bootstrapped capacitor in erase mode, and voltage $V_R$ applied to the control gate in write mode, may be appropriate constant values. However a rising voltage prevents sharply stressing and damaging the tunnel oxide. Other voltage patterns may also be employed, and the voltages may be applied differently than as described herein. For example, voltages may be applied by any suitable electronic switch, or may in some cases, be supplied by selectively turning a voltage source on and off.

Changes may also be made to the programming circuit. In particular, one circuit may be used for both write and erase, by providing a two-position switch connected to terminal 6 of the capacitor, and by so controlling the switch that terminal 6 is connected to voltage $V_p$ for erasing, and is grounded for writing. The switches themselves may be formed in any manner, e.g., by means of MOS transistors; and the circuit may be formed separately or integrated with MOSFET transistor 1 and the voltage source section.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of tunnel-effect programming a MOSFET transistor having a control terminal, a pair of terminals including a source terminal and a drain terminal, and a floating gate region insulated with respect to said pair of terminals by a dielectric layer, the method comprising the steps of:

connecting to a first terminal of said pair of terminals a bootstrap capacitor, the charge state of which depends on the charge state of said floating gate region; and biasing said dielectric layer of said MOSFET transistor so that:

a) said bootstrap capacitor causes the passage of tunneling current between said first terminal and said floating gate region, through said dielectric layer, thereby said floating gate region changes charging state, prior to said floating gate reaching a desired charge level; and b) passage of said tunneling current is automatically cut off when said desired charge level is reached.

2. A method as claimed in claim 1, wherein said first terminal is a drain terminal.

3. A method as claimed in claim 1, for controlled erasing said MOSFET transistor, comprising the steps of:

initially charging said bootstrapped capacitor to a predetermined charge voltage;

applying to said control terminal of said transistor a control voltage, the level of which is correlated to said desired charge level;

generating a total voltage equal to the sum of said predetermined charge voltage and an erase voltage;

applying said total voltage to said first terminal of said transistor; and selecting the values of said charge voltage, said erase voltage and said control voltage to supply said tunneling current and alter a charge level stored in said floating gate region as long as said charge level differs from said desired level, and to turn on said MOSFET transistor, discharge said bootstrap capacitor and reduce said total voltage at said first terminal and arrest said tunnel current, when said charge level becomes substantially equal to said desired level.

4. A method as claimed in claim 3, where said step of generating said total voltage further comprises:

applying said erase voltage to a terminal of said bootstrapped capacitor not connected to said first terminal.

5. A method as claimed in claim 3, further comprising the step of:

increasing said erase voltage from a minimum to a maximum value during the step of applying.

6. A method as claimed in claim 1, for controlled writing said MOSFET transistor, comprising cyclic repetition of the steps of:

charging said bootstrapped capacitor to a predetermined charge voltage;

applying to said control terminal of said transistor a control voltage, the level of which is correlated to said desired charge level;

applying a write voltage to said control terminal of said transistor; and selecting values of said charge voltage, said control voltage and said write voltage to discharge the bootstrapped capacitor when said control voltage is applied and said floating gate has a charge level other than said desired level, and subsequently permit the passage of tunneling current between said first terminal and said floating gate when said write voltage is applied and said bootstrapped capacitor is discharged, and to substantially prevent discharging of said bootstrapped capacitor when said control voltage is applied and said floating gate has a charge level substantially equal to said desired level, and subsequently prevent the passage of said tunneling current when said write voltage is applied and said bootstrapped capacitor is still substantially charged.

7. A method as claimed in claim 6, further comprising the step of:

increasing said write voltage from a minimum to a maximum value during the step of applying.

8. A circuit for tunnel-effect programming a MOSFET transistor having a control terminal, a pair of terminals including a source terminal and a drain terminal, and a floating gate region insulated with respect to said pair of terminals by a dielectric layer, comprising:

a bootstrap capacitor having a first terminal connected to a first terminal of said pair of terminals of said transistor, a voltage across of said bootstrapped capacitor depending on a voltage on said floating gate region;

first biasing means connected to said bootstrap capacitor, for charging said bootstrap capacitor to a charge voltage; and second biasing means connected to said control terminal of said transistor, for biasing said dielectric layer so that the voltage across said bookstrap capacitor causes passage of tunneling current between said first terminal and said floating gate region and through said dielectric layer until said floating gate region reaching a desired charge level, thus changing the voltage across the bootstrap capacitor, automatically cutting off passage of said tunneling current, when said desired charge level is reached.

9. A circuit as claimed in claim 8, wherein said first biasing means further comprises:

a first switch interposed between a reference potential line and a first terminal of said bootstrapped capacitor connected to said first terminal of said transistor.

10. A circuit as claimed in claim 8, wherein said second biasing means further comprises:

a second switch interposed between said control terminal and a threshold potential line at a potential correlated to said desired charge level.

11. A circuit as claimed in claim 10, wherein said second biasing means further comprises:

means for biasing a second terminal of said bootstrapped capacitor to an erase voltage.

12. A circuit as claimed in claim 10, further comprising:

a write potential line, and where said second switch is switchable between a position connecting said control terminal to said threshold potential line and a position connecting said control terminal to said write potential line.

13. A circuit as claimed in claim 10, further comprising:

a third switch interposed between a second terminal of the pair of terminals and a reference potential line.

14. A circuit for programming a MOSFET transistor to a precise output level, the MOSFET transistor having a control terminal, a first and second output terminal, and a floating gate insulated from the control terminal and the first and second output terminals by a dielectric layer, comprising:

means connected to the first output terminal, for applying a charge thereto;

means connected to the means for applying, for setting the charge applied by the means connected to the first output terminal as a value depending on a charge carried by the floating gate;

means connected to the control terminal, for biasing the dielectric layer to cause charge from the means for applying to tunnel into the floating gate, until the floating gate reaches a desired charge level.

15. A circuit as claimed in claim 14, wherein the means for applying further comprises:

a capacitor having a first terminal connected to the first output terminal and a second terminal connected to a reference voltage line.

16. A circuit as claimed in claim 15, wherein the reference voltage line carries a time-varying reference voltage.

17. A circuit as claimed in claim 16, wherein the time-varying reference voltage includes an initial ramp from a minimum value to a maximum value.

18. A circuit as claimed in claim 14, wherein the means for biasing further comprises:

a reference voltage line;

a write voltage line; and means for selectively connecting the reference voltage line and the write voltage line to the control terminal.

19. A circuit as claimed in claim 14, wherein the means for defining further comprises:

a common voltage line; and means for selectively connecting the second output terminal to the common voltage line.

20. A method of tunnel-effect programming a MOSFET transistor having a control terminal, a pair of terminals including a source terminal and a drain terminal, and a floating gate region insulated with respect to said pair of terminals by a dielectric layer, the method comprising the steps of:

connecting to a first terminal of said pair of terminals a bootstrapped capacitor, the charge state of which depends on the charge state of said floating gate region; and biasing said dielectric layer of said MOSFET transistor so that said bootstrapped capacitor causes the passage of tunneling current between said first terminal and said floating gate region and through said dielectric layer prior to said floating gate region reaching a desired charge level, thereby changing its charge state to automatically cut off passage of said tunneling current when said desired charge level is reached.

21. A method as claimed in claim 1, wherein said first terminal is a drain terminal.

22. A method as claimed in claim 1, for controlled erasing said MOSFET transistor, comprising the steps of:

initially charging said bootstrapped capacitor to a predetermined charge voltage;

applying to said control terminal of said transistor a control voltage, the level of which is correlated to said desired charge level;

generating a total voltage equal to the sum of said charge voltage and an erase voltage;

applying said total voltage to said first terminal of said transistor; and selecting the values of said charge voltage, said erase voltage and said control voltage to supply said tunneling current and alter a charge level stored in said floating gate region as long as said charge level differs from said desired level, and to turn on said MOSFET transistor, discharge said bootstrapped capacitor, and so reduce the value of said total voltage at said first terminal and arrest said tunnel current, when said charge level becomes substantially equal to said desired level.

23. A method as claimed in claim 3, where said step of generating said total voltage further comprises:

applying said erase voltage to a terminal of said bootstrapped capacitor not connected to said first terminal.

24. A method as claimed in claim 3, further comprising the step of:

increasing said erase voltage from a minimum to a maximum value during the step of applying.

25. A method as claimed in claim 1, for controlled writing said MOSFET transistor, comprising cyclic repetition of the steps of:

charging said bootstrapped capacitor to a predetermined charge voltage;

applying to said control terminal of said transistor a control voltage, the level of which is correlated to said desired charge level;

applying a write voltage to said control terminal of said transistor; and selecting values of said charge voltage, said control voltage and said write voltage to discharge the bootstrapped capacitor when said control voltage is applied and said floating gate presents a charge level other than said desired level, and subsequently permit the passage of tunneling current between said first terminal and said floating gate when said write voltage is applied and said bootstrapped capacitor is discharged, and to substantially prevent discharging of said bootstrapped capacitor when said control voltage is applied and said floating gate presents a charge level substantially equal to said desired level, and subsequently prevent the passage of said tunneling current when said write voltage is applied and said bootstrapped capacitor is still substantially charged.

26. A method as claimed in claim 6, further comprising the step of:

increasing said write voltage from a minimum to a maximum value during the step of applying.

27. A circuit for programming a MOSFET transistor to a precise output level, the MOSFET transistor having a control terminal, a first and second output terminal, and a floating gate insulated from the control terminal and the first and second output terminals by a dielectric layer, comprising:

means connected to the first output terminal, for applying a charge thereto;

means connected to the means for applying, for defining the charge applied by the means connected to the first output terminal as a value depending on a charge carried by the floating gate;

means connected to the control terminal, for biasing the dielectric layer to cause charge from the means for applying to tunnel into the floating gate, until the floating gate reaches a desired charge level.

28. A circuit as claimed in claim 14, wherein the means for applying further comprises:

a capacitor having a first terminal connected to the first output terminal and a second terminal connected to a reference voltage line.

29. A circuit as claimed in claim 15, wherein the reference voltage line carries a time-varying reference voltage.

30. A circuit as claimed in claim 16, wherein the time-varying reference voltage includes an initial ramp from a minimum value to a maximum value.

31. A circuit as claimed in claim 14, wherein the means for biasing further comprises:

a reference voltage line;

a write voltage line; and means for selectively connecting the reference voltage line and the write voltage line to the control terminal.

32. A circuit as claimed in claim 14, wherein the means for defining further comprises:

a common voltage line; and means for selectively connecting the second output terminal to the common voltage line.

* * * * *